(12) United States Patent
Min et al.

(10) Patent No.: US 11,276,809 B2
(45) Date of Patent: Mar. 15, 2022

(54) CHALCOGEN-CONTAINING COMPOUND, ITS PREPARATION METHOD AND THERMOELECTRIC ELEMENT COMPRISING THE SAME

(71) Applicant: LG CHEM, LTD., Seoul (KR)

(72) Inventors: Yu Ho Min, Daejeon (KR); Cheol-Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 574 days.

(21) Appl. No.: 16/312,842

(22) PCT Filed: Oct. 17, 2017

(86) PCT No.: PCT/KR2017/011479
§ 371 (c)(1),
(2) Date: Dec. 21, 2018

(87) PCT Pub. No.: WO2018/080085
PCT Pub. Date: May 3, 2018

(65) Prior Publication Data
US 2019/0288172 A1    Sep. 19, 2019

(30) Foreign Application Priority Data

Oct. 31, 2016 (KR) .................. 10-2016-0142891
Oct. 16, 2017 (KR) .................. 10-2017-0134204

(51) Int. Cl.
*H01L 35/16* (2006.01)
*C01B 19/00* (2006.01)
(Continued)

(52) U.S. Cl.
CPC ............ *H01L 35/16* (2013.01); *C01B 19/002* (2013.01); *C01B 19/02* (2013.01); *H01L 35/34* (2013.01);
(Continued)

(58) Field of Classification Search
CPC ......... H01L 35/16; H01L 35/34; H01L 35/18; C01B 19/02; C01B 19/002;
(Continued)

(56) References Cited

U.S. PATENT DOCUMENTS 6,013,204 A    1/2000  Kanatzidis et al.
6,312,617 B1 *  11/2001  Kanatzidis ............ H01L 31/032
                                                        252/62.3 T
(Continued)

FOREIGN PATENT DOCUMENTS

CN          104261357 B    6/2016
KR     10-2011-0109562 A   10/2011
(Continued)

OTHER PUBLICATIONS

Extended European Search Report, dated May 20, 2019, for European Application No. 17865873.8.
(Continued)

*Primary Examiner* — Andrew J. Oyer
(74) *Attorney, Agent, or Firm* — Birch, Stewart, Kolasch & Birch, LLP (57) ABSTRACT

A chalcogen-containing compound that exhibits low thermal conductivity and excellent thermoelectric properties, and exhibits excellent phase stability even at relatively low temperature, a method for preparing the same, and a thermoelectric element including the same.

13 Claims, 9 Drawing Sheets (51) Int. Cl.
*H01L 35/34* (2006.01)
*C01B 19/02* (2006.01)
(52) U.S. Cl.
CPC ...... *C01P 2002/72* (2013.01); *C01P 2002/76* (2013.01); *C01P 2002/77* (2013.01); *C01P 2006/32* (2013.01); *C01P 2006/40* (2013.01)
(58) Field of Classification Search
CPC .............. C01P 2002/72; C01P 2002/76; C01P 2002/77; C01P 2006/32; C01P 2006/40; C01P 2004/38; C01G 29/006
See application file for complete search history.

(56) References Cited

U.S. PATENT DOCUMENTS

| | | |
|---|---|---|
| 2011/0240083 A1 | 10/2011 | Rhyee et al. |
| 2016/0099396 A1 | 4/2016 | Lee et al. |
| 2016/0204327 A1 | 7/2016 | Kwon et al. |

FOREIGN PATENT DOCUMENTS

| | | |
|---|---|---|
| KR | 10-1172802 B1 | 8/2012 |
| KR | 10-2014-0116668 A | 10/2014 |
| KR | 10-2015-0040240 A | 4/2015 |
| KR | 10-2016-0120358 A | 10/2016 |

OTHER PUBLICATIONS

Mrotzek et al., "Structure and thermoelectric properties of the new quaternary tin selenide $K_{1-x}Sn_{5-x}Bi_{11-x}Se_{22}$", J. Mater. Chem., vol. 10, 2000, pp. 1667-1672 (6 pages).

Adouby et al., "Structure and temperature transformation of SnSe. Stabilization of a new cubic phase $Sn_4Bi_2Se_7$", Z. Kristallogr. 1998, vol. 213, pp. 343-349.

Adouby et al., "X-ray diffraction, $^{199}$Sn Mössbauer and thermal study of SnSe—$Bi_2Se_3$ system", Journal of Alloys and Compounds, 2008, vol. 453, pp. 161-166.

Hsu et al., "$CsMBi_3Te_6$ and $CsM_2Bi_3Te_7$ (M=Pb, Sn): New Thermoelectric Compounds with Low-Dimensional Structures", J. Am. Chem. Soc. 2002, vol. 124, No. 11, pp. 2410-2411.

International Search Report (PCT/ISA/210) issued in PCT/KR2017/011479, dated Feb. 7, 2018.

Mrotzek et al., "New Members of the Homologous Series $A_m[M_6Se(g)]m[M_{5+n}Se_{9+n}]$: The Quaternary Phases $A_{1-x}M'_{3-x}Bi_{11+x}Se_{20}$ and $A_{1+x}M'_{3-2x}Bi_{7+x}Se_{14}$ (A=K, Rb, Cs; M'=Sn, Pb)," Inorg. Chem., vol. 40, No. 24, 2001, pp. 6204-6211.

Mrotzek et al., "Structure and Thermoelectric Properties of the New Quaternary Bismuth Selenides $A_{1-x}M_{4-x}Bi_{11+x}Se_{21}$ (A=K and Rb and Cs; M=Sn and Pb)—Members of the Grand Homologous Series $K_m(M_6Se(g))m(M_{5+n}Se_{9+n})$," Chem. Eur. J., vol. 7, No. 9, 2001, pp. 1915-1926.

\* cited by examiner

CHALCOGEN-CONTAINING COMPOUND, ITS PREPARATION METHOD AND THERMOELECTRIC ELEMENT COMPRISING THE SAME

CROSS-REFERENCE TO RELATED APPLICATION(S)

This application claims the benefit of Korean Patent Application No. 10-2016-0142891 filed on Oct. 31, 2016 and Korean Patent Application No. 10-2017-0134204 filed on Oct. 16, 2017 with the Korean Intellectual Property Office, the disclosure of which is herein incorporated by reference in its entirety.

TECHNICAL FIELD

The present invention relates to a novel chalcogen-containing compound that exhibits low thermal conductivity and excellent thermoelectric properties, and exhibits excellent phase stability even at relatively low temperature, a method for preparing the same, and a thermoelectric element including the same.

BACKGROUND

Due to recent environmental problems caused by resource depletion and combustion, studies on thermoelectric conversion materials using waste heat are progressing as one of alternative energy sources.

The energy conversion efficiency of such thermoelectric conversion material depends on a thermoelectric figure of merit (ZT). Here, ZT is determined according to the Seebeck coefficient, electrical conductivity, thermal conductivity, etc., and more specifically, it is proportional to the square of the Seebeck coefficient and electrical conductivity, and is inversely proportional to thermal conductivity. Thus, in order to increase the energy conversion efficiency of a thermoelectric element, the development of a thermoelectric conversion material having a high Seebeck coefficient or electrical conductivity or low thermal conductivity is required.

Among the various thermoelectric conversion materials known before, thermoelectric conversion materials with a crystal lattice structure related to or similar to sodium chloride (NaCl), in which a part of the lattice site is vacant, such as PbTe, $Bi_2Te_3$, SnSe, etc., for example, are known to exhibit an excellent thermoelectric conversion property. That is, it is considered that materials having such a crystal lattice structure exhibit excellent electrical conductivity due to the crystal lattice structure similar to sodium chloride, and exhibit low thermal conductivity because a part of the lattice site becomes vacant. Thus, thermoelectric conversion materials having the above-described crystal lattice structure are known to have an excellent thermoelectric conversion property, and thus are being applied.

Figure 1:
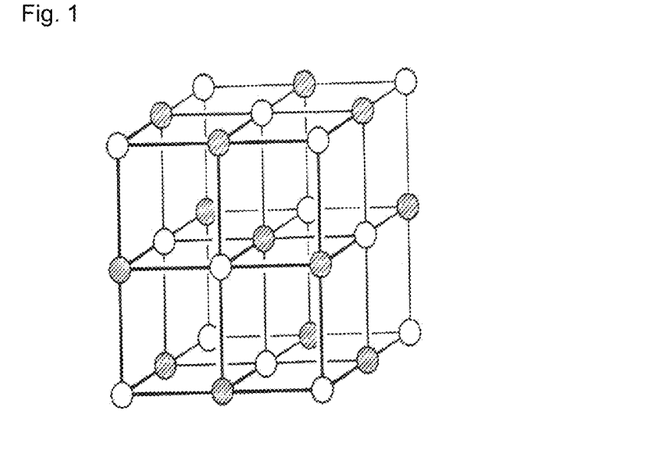
FIG. 1 is a schematic diagram showing the face-centered cubic lattice structure that is exhibited by sodium chloride, etc.

Nevertheless, little is known about a thermoelectric conversion material that has face-centered cubic lattice structure identical to sodium chloride as shown in FIG. 1, in which a part of the lattice site is vacant.

Figure 2:
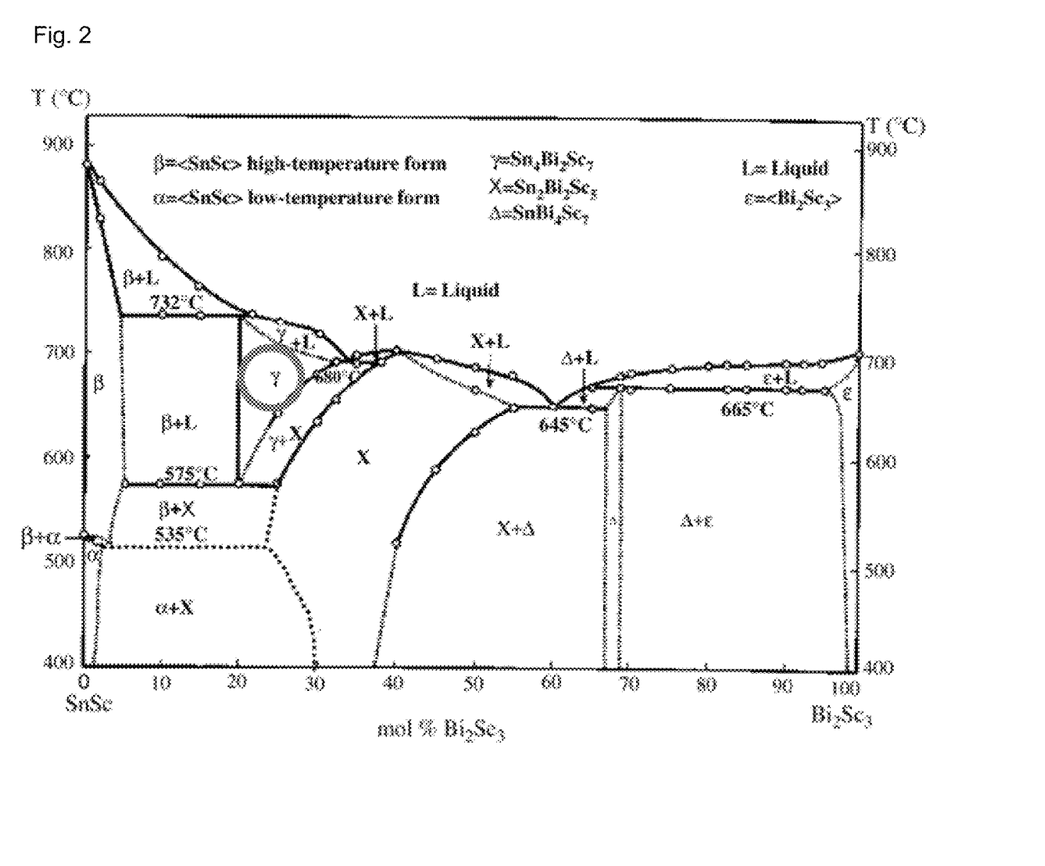
FIG. 2 is a phase stability diagram of representative Sn—Bi—Se-based chalcogen compounds.

However, $Sn_4Bi_2Se_7$, one of Si—Bi—Se-based chalcogen compounds, is known to have an identical face-centered cubic lattice structure to that of sodium chloride, and includes a lattice site of which a part is vacant. For reference, FIG. 2 shows a phase stability diagram of representative Sn—Bi—Se-based chalcogen compounds, wherein $Sn_4Bi_2Se_7$ is known to have the face-centered cubic lattice structure at a temperature of about 580 to 720° C. (a part indicated by a circle in FIG. 2).

However, such chalcogen compounds maintain stability only at a temperature range of about 580 to 720° C., and at lower temperature, particularly at the driving temperature of a thermoelectric element, they cannot exhibit phase stability because they are decomposed to other phases.

Consequently, although it is expected that the above-described chalcogen compound exhibits low thermal conductivity and an excellent thermoelectric property because it has a face-centered cubic lattice structure including a lattice site of which a part is vacant, it exhibits inferior phase stability at a low temperature of about 580° C. or less, corresponding to the general driving temperature of thermoelectric elements, and thus application as a thermoelectric conversion material is very limited.

Technical Problem

The present invention provides a novel chalcogen-containing compound that exhibits low thermal conductivity and excellent thermoelectric properties, and exhibits excellent phase stability even at relatively low temperature, and a method for preparing the same.

Further, the present invention provides a thermoelectric element including the chalcogen-containing compound.

Technical Solution

The present invention provides a chalcogen-containing compound represented by the following Chemical Formula 1:

$$M_xSn_yBi_zSe_7 \quad \text{[Chemical Formula 1]}$$

wherein, in Chemical Formula 1, M is an alkali metal,
x, y and z are mole ratios of M, Sn, and Bi respectively,
x is greater than 0 and equal to or less than 2, y is greater than 0 and equal to or less than 4, z is greater than 0 and equal to or less than 2, y+z is greater than 0 and equal to or less than 6, and x+y+z is greater than 0 and equal to or less than 7.

The present invention also provides a method for preparing the chalcogen-containing compound, comprising the steps of:

progressing a solid phase reaction of a mixture comprising raw materials comprising Sn, Bi and Se, and raw material comprising alkali metal (M), grinding the product of the solid phase reaction; and sintering the ground product.

The present invention also provides a thermoelectric element comprising the chalcogen-containing compound as a thermoelectric conversion material.

DETAILED DESCRIPTION OF THE EMBODIMENTS

Hereinafter, a chalcogen-containing compound, a method for preparing the same, and a thermoelectric element including the same according to specific embodiments of the invention will be explained in detail.

According to one embodiment of the present invention, a chalcogen-containing compound represented by the following Chemical Formula 1 is provided.

$$M_xSn_yBi_zSe_7 \quad \text{[Chemical Formula 1]}$$

wherein, in Chemical Formula 1, M is an alkali metal,
x, y and z are mole ratios of M, Sn, and Bi respectively,
x is greater than 0 and equal to or less than 2, y is greater than 0 and equal to or less than 4, z is greater than 0 and equal to or less than 2, y+z is greater than 0 and equal to or less than 6, and x+y+z is greater than 0 and equal to or less than 7.

The chalcogen-containing compound of the one embodiment is a compound represented by Chemical Formula 1 in which an alkali metal is added to a chalcogen compound such $Sn_4Bi_2Se_7$, and it has the same crystal lattice structure as $Sn_4Bi_2Se_7$, that is, a crystal structure of a face-centered cubic lattice structure that is identical to that of sodium chloride.

More specifically, in the compound of the one embodiment, it appears that a part of a vacancy excluding the sites filled with Se, Sn and Bi is filled with the alkali metal atom, in the face-centered cubic lattice structure. A vacancy remaining after filled with the alkali metal atom may be maintained as it is, and the value of 7−(x+y+z) may be defined as the mole ratio of the vacancy.

As demonstrated in the examples described below, it was confirmed that the compound of the one embodiment can exhibit excellent electrical conductivity due to the crystal lattice structure of a face-centered cubic lattice structure and the addition of an alkali metal. This results from the crystal lattice structure, and simultaneously, is because the alkali metal becomes in the form of ions, thus donating additional electrons.

Further, the compound of the one embodiment has the above-described specific crystal structure, but the alkali metal does not completely fill the vacant lattice site, and a part thereof remains, and thus, the compound has low thermal conductivity. Thus, the compound of the one embodiment exhibits excellent thermoelectric conversion property resulting from high electric conductivity and low thermal conductivity.

Moreover, it was confirmed that since the chalcogen-containing compound of the one embodiment has an alkali metal added in the crystal lattice structure, it exhibits excellent phase stability even at a low temperature (for example, a temperature of about 580° C. or more) corresponding to the driving temperature of a thermoelectric element. Such excellent phase stability can be confirmed by the maintenance of an identical XRD pattern and an identical crystal structure without decomposition of the compound, even when the chalcogen-containing compound of the one embodiment is finally prepared and left in the form of a sintered body, as shown in FIG. 2.

Thus, the chalcogen-containing compound of one embodiment overcomes the problems of previously known $Sn_4Bi_2Se_7$, etc. in terms of inferior phase stability, and exhibits excellent phase stability even at the general driving temperature of a thermoelectric element, and simultaneously, exhibits excellent electrical conductivity, low thermal conductivity and excellent thermoelectric conversion property due to the unique crystal lattice structure. Thus, the chalcogen-containing compound of one embodiment can be very preferably used as a thermoelectric conversion material in various fields and applications.

Meanwhile, as explained above, in the face-centered cubic lattice structure of the chalcogen-containing compound of one embodiment, at least a part of the vacancy excluding the sites filled with Se, Sn, and Bi is filled with the alkali metal atom. More specifically, in such a face-centered cubic lattice structure, the Se fills the anion sites of the face-centered cubic lattice structure, the Sn and Bi fill the cation sites of the face-centered cubic lattice structure, and the alkali metal (M) fills a part of a vacancy of the cation sites remaining after filled with Sn and Bi.

Herein, the alkali metal, and Sn and Bi that fill each cation site become cations, and can donate electrons, thus contributing to the excellent electrical conductivity of the compound of one embodiment. In addition, since the addition of the alkali metal may contribute to excellent phase stability, and the alkali metal cannot completely fill the vacant lattice site and a vacancy remains, the chalcogen-containing compound of one embodiment may exhibit low thermal conductivity.

As the alkali metal, one or more alkali metals selected from the group consisting of Na, and K may be used, but considering high electrical conductivity and excellent phase stability of the compound of one embodiment, Na may be appropriately used.

And, in the Chemical Formula 1, x, y and z denote mole ratios of M, Sn, and Bi respectively, wherein x is greater than 0 and equal to or less than 2 (or greater than 0 and less than 2), y is greater than 0 and equal to or less than 4, z is greater than 0 and equal to or less than 2, y+z is greater than 0 and equal to or less than 6, and x+y+z is greater than 0 and equal to or less than 7. More specifically, x may be 0.05 to 0.8, or 0.1 to 0.5, or 0.2 to 0.4, y may be 3.5 to 4, or 3.7 to 4, or 3.9 to 4, z may be 1.5 to 2, or 1.7 to 2, or 1.9 to 2. And, y+z may be 5 to 6, or 5.4 to 6, or 5.8 to 6, and x+y+z may be 5 to 6.8, or 6.1 to 6.8, or 6.2 to 6.8.

As explained above, the value of 7−(x+y+z) may be defined as the mole ratio of a vacancy remaining after filled with the above explained atoms, and it may be greater than 0, or greater than 0 and equal to or less than 0.2.

By fulfilling each mole ratio, the compound of one embodiment can maintain the unique crystal lattice structure, and yet, exhibit excellent phase stability due to the addition of an alkali metal, and exhibit low thermal conductivity because the alkali metal does not excessively fills the vacant lattice sites. Also, since the mole ratios of the alkali metal, Bi, etc. that donate electrons are optimized, the compound of one embodiment can exhibit more excellent electrical conductivity.

Since the chalcogen-containing compound of the above-explained one embodiment has low thermal conductivity, high electrical conductivity, and the resulting excellent thermoelectric conversion property, and high phase stability, it can be preferably used as a thermoelectric conversion material in various thermoelectric cooling systems, thermoelectric generation systems, etc.

Meanwhile, according to another embodiment of the present invention, a method for preparing the above-explained chalcogen-containing compound is provided. The preparation method includes the steps of: progressing a solid phase reaction of a mixture comprising raw materials comprising Sn, Bi and Se, and raw material comprising alkali metal (M); grinding the product of the solid phase reaction; and sintering the ground product.

In the preparation method, as the raw material comprising Sn, Bi and Se, for example, each powder of Sn, Bi and Se may be used, and as the raw material comprising alkali metal, although specifically limited, $M_2Se$ (M is an alkali metal) powder may be used.

And, each raw material may be mixed at a ratio corresponding to the mole ratio (x, y, z 7) of the Chemical Formula 1. For example, in case each Sn, Bi and Se powder and $M_2Se$ powder are used as raw materials, each raw material of $M_2Se$, Sn, Bi and Se may be mixed at a mole ratio of x/2:y:z:7−x, considering that Se is also included in the raw material of $M_2Se$.

The formation of the mixture of raw materials may be performed by adding each raw material at predetermined rates, then grinding or milling, and selectively pelletizing. The formed mixture may be in the state of a powder, pellet, ingot, etc. according to the process.

A solid phase state reaction step for such a mixture may be progressed. Such a solid phase reaction step may be conducted by various intermetallic reaction processes known before, and for example, it may be progressed at a temperature of 500 to 700° C. for each powder raw material. Heat treatment for such a solid phase reaction may be progressed in a furnace such as an electric furnace, etc., and it may be progressed under vacuum or inert gas atmosphere.

And, although the heat treatment and solid phase reaction may be progressed in a single step, they may be divided into two or more steps and progressed.

After the solid phase reaction, the reaction product is ground. Such a grinding step may be performed using a previously known method and apparatus for preparing a thermoelectric conversion material, and through the grinding step, a powder product may be obtained.

Meanwhile, between the solid phase reaction step and the grinding step, a step of cooling the product of the solid phase reaction step to form an ingot may be further performed. Here, the cooling may be performed using various cooling media, and any cooling devices and methods previously used in the preparation process of a thermoelectric conversion material may be used without specific limitations. After forming an ingot through the cooling step, the ingot may be ground.

After the grinding step, the ground product may be sintered. By performing the sintering step, a chalcogen-containing compound in the form of a sintered body may be prepared.

Such a sintering step may be performed by spark plasma sintering, etc. that are well known to a person having ordinary knowledge, and for example, it may be performed at a temperature of 550° C. or more and a pressure of 10 MPa or more. According to a more specific embodiment, the sintering step may be performed at a temperature of 550 to 700° C. and a pressure of 10 to 100 MPa for 5 to 10 minutes.

After performing the sintering, a cooling step may be further performed.

Since the above-explained steps may be performed by applying common preparation conditions, methods, and apparatuses for forming a metal compound such as a chalcogen compound or thermoelectric conversion material, and specific reaction conditions and methods are described in the examples below, additional explanations thereof are omitted.

According to yet another embodiment of the present invention, a thermoelectric element including the chalcogen-containing compound of the above embodiment as a thermoelectric conversion material is provided. Such a thermoelectric element may include the chalcogen-containing compound of the above embodiment (thermoelectric conversion material) as a p-type or n-type thermoelectric conversion material, and for this, it may include a compound additionally doped with an additional p-type or n-type element as a thermoelectric conversion material. The kind of the p-type element or n-type element or doping method that can be used is not specifically limited, and elements and doping methods commonly used to apply a thermoelectric conversion material as a p-type or n-type before may be used.

The thermoelectric element may include a thermoelectric element formed by processing and molding a p-type or n-type thermoelectric conversion material obtained in the form of a sintered body, and it may include an insulation substrate and electrode for the combination structure of the thermoelectric element, insulation substrate, and electrode, the structure of a common thermoelectric element may be applied.

As the insulation substrate, a sapphire substrate, a silicon substrate, a Pyrex substrate, a quartz substrate, etc. may be used, and as the electrode, any electrodes including metals or conductive metal compounds may be used.

Since the above-explained thermoelectric element includes the thermoelectric conversion material of one embodiment, it may exhibit an excellent thermoelectric conversion property, and may be preferably applied as a thermoelectric cooling system, thermoelectric generation system, etc. in various fields and uses.

Effects of the Invention

According to the present invention, a novel chalcogen-containing compound that exhibits low thermal conductivity and excellent thermoelectric properties, and exhibits excellent phase stability even at relatively low temperature, and a method for preparing the same can be provided. By applying such a chalcogen-containing compound, a thermoelectric element exhibiting excellent properties can be provided.

EXAMPLES

The present invention will be explained in more detail in the following examples. However, these examples are presented only as illustrations of the present invention, and the scope of the present invention is not limited thereby.

Example 1: Preparation of a Chalcogen-Containing Compound ($Na_{0.2}Sn_4Bi_2Se_7$)

Each powder of high purity raw materials of Sn, Bi, Se and $Na_2Se$ was weighed in a glove box at a mole ratio of 4:2:6.9 (7−0.1):0.1, put in a carbon crucible, and then charged into a quartz tube. The inside of the quartz tube was evacuated and sealed. The raw materials were maintained at a constant temperature in an electric furnace at 620° C. for 24 hours.

Thereafter, the quartz tube in which a reaction was performed was cooled with water to obtain an ingot, the ingot was finely ground to powder with a particle diameter of 75 μm or less, and sintered by spark plasma sintering (SPS) at a temperature of 620° C. and a pressure of 50 MPa for 10 minutes, thus preparing a chalcogen-containing compound of $Na_{0.2}Sn_4Bi_2Se_7$.

Example 2: Preparation of a Chalcogen-Containing Compound ($Na_{0.4}Sn_4Bi_2Se_7$)

A chalcogen-containing compound of $Na_{0.4}Sn_4Bi_2Se_7$ was prepared by the same method as Example 1, except that each powder of high purity raw materials of Sn, Bi, Se and $Na_2Se$ was mixed in a glove box at a mole ratio of 4:2:6.8 (7−0.2):0.2.

Example 2: Preparation of a Chalcogen-Containing Compound ($Na_{0.75}Sn_4Bi_{1.7}Se_7$)

A chalcogen-containing compound of $Na_{0.75}Sn_4Bi_{1.7}Se_7$ was prepared by the same method as Example 1, except that each powder of high purity raw materials of Sn, Bi, Se and $Na_2Se$ was mixed in a glove box at a mole ratio of 4:1.7:6.625 (7−0.375):0.375.

Comparative Example 1: Preparation of a Chalcogen-Containing Compound ($Sn_4Bi_2Se_7$)

A chalcogen-containing compound of $Sn_4Bi_2Se_7$ was prepared by the same method as Example 1, except that each powder of high purity raw materials of Sn, Bi and Se was mixed in a glove box at a mole ratio of 4:2:7.

Experimental Examples

1. Phase Analysis According to XRD Pattern

Figure 3:
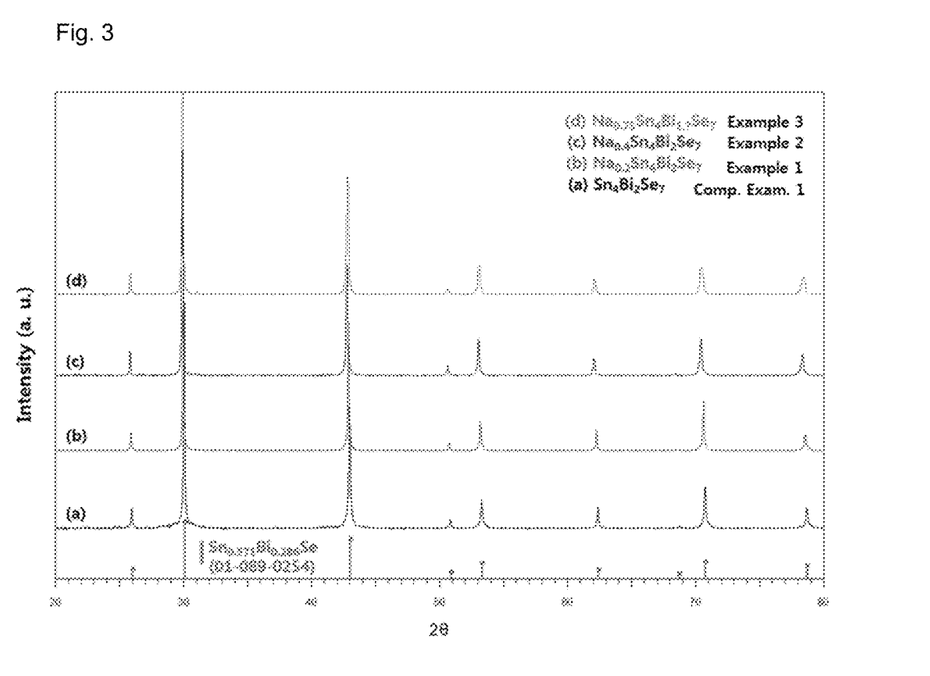
FIG. 3 is a graph showing X-ray diffraction analysis results of a chalcogen compound powder immediately before passing through a sintering process in Examples 1 to 3 and Comparative Example 1.
Figure 4:
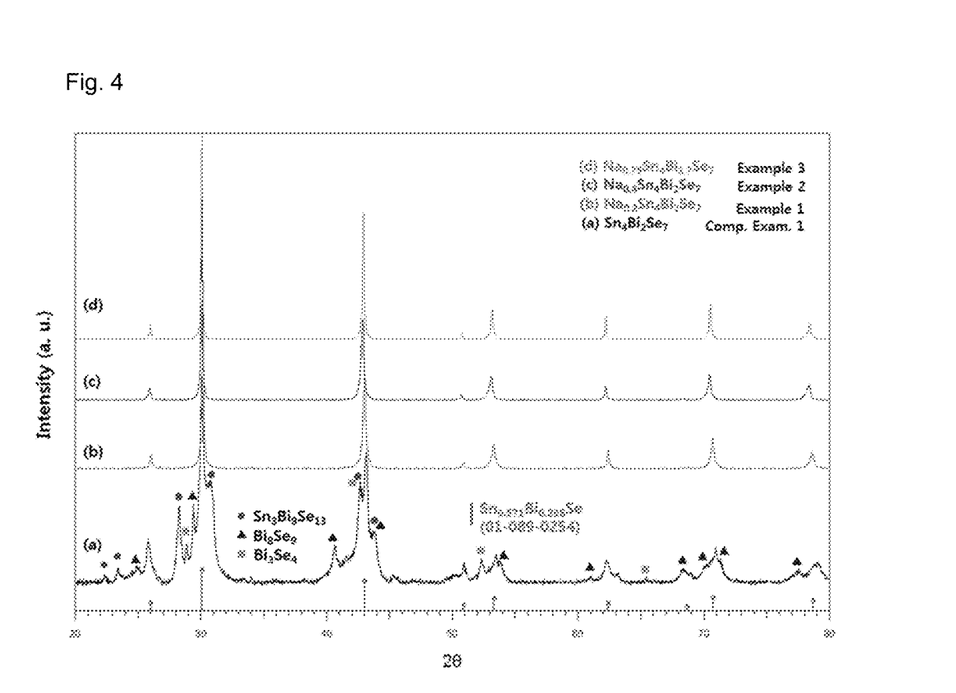
FIG. 4 is a graph showing X-ray diffraction analysis results of the sintered bodies finally prepared through a sintering process, after slow cooling and leaving at room temperature, in Examples 1 to 3 and Comparative Example 1.

For the powder chalcogen-containing compounds immediately before the sintering process in Examples 1 to 3 and Comparative Example 1, X-ray diffraction analysis was performed and the results are shown in FIG. 3. And, the sintered bodies finally prepared through the sintering processes in Examples 1 to 3 and Comparative Example 1 were slowly cooled from about 620° C. to 300° C., and then cooled again to room temperature (25° C.), and the sintered bodies were maintained under an air atmosphere for 15 days, and then each sintered body was subjected to X-ray diffraction analysis, and the results are shown in FIG. 4.

And, using the TOPAS program, the lattice parameter of each powder chalcogen-containing compound of Examples 1 to 3 and Comparative Example 1 was calculated and is shown in the following Table 1.

TABLE 1

| Powder material | Lattice parameter (Å) |
| --- | --- |
| Example 1 | 5.9523 |
| Example 2 | 5.9665 |
| Example 3 | 5.9642 |
| Comparative Example | 5.9448 |

In addition, for the powder chalcogen-containing compounds of Examples 1 to 3 and Comparative Example 1, the number of atoms for each component in the unit lattice is shown in the following Table 2.

TABLE 2

| Powder material | Number of atoms for each component in unit lattice | | | | |
| --- | --- | --- | --- | --- | --- |
| | Sn | Bi | Se | Vacancy | Na |
| Example 1 | 2.2853 | 1.1426 | 4 | 0.458 | 0.114 |
| Example 2 | 2.2853 | 1.1426 | 4 | 0.344 | 0.228 |
| Example 3 | 2.2853 | 1 | 4 | 0.286 | 0.4287 |
| Comparative Example 1 | 2.2853 | 1.1426 | 4 | 0.572 | 0 |

First, referring to FIG. 3, it was confirmed that all the powder chalcogen-containing compounds of Examples 1 to 3 have crystal lattice structures identical to the chalcogen-containing compound of Comparative Example 1 (i.e., $Sn_4Bi_2Se_7$ which was previously known to have a face-centered cubic lattice structure at a high temperature), and thus it was confirmed that all the compounds of Examples 1 to 3 have a crystal lattice structure of a face-centered cubic lattice structure.

And, referring to Table 1, in Examples 1 to 3, with the addition of alkali metal (Na), a lattice parameter increased compared to Comparative Example 1, and thus, it is inferred that the alkali metal fills a vacancy of the crystal lattice structure. Particularly, comparison of Examples 1 and 2 shows that a lattice parameter increases as the content of alkali metal increases, but Example 3 with relatively small Bi rate exhibits deceased lattice parameter compared to Example 2, and thus, it is confirmed that the alkali metal fills a vacancy of the crystal lattice structure, but since the atomic radius of the alkali metal (Na) is smaller than that of Bi, Example 3 exhibits decreased lattice parameter.

And, referring to Table 2, it is expected that in Examples 1 to 3 including an alkali metal, the concentration of the vacancy of the lattice structure decreases compared to Comparative Example 1, and that in Examples 1 and 2, the concentration of electrons increases due to electron donation by the alkali metal. Meanwhile, it is expected that in the case of Example 3 with decreased Bi content, the concentration of electrons decreases (the concentration of holes increases) because $Na^+$ donates two less electrons compared to $Bi^{3+}$.

Referring to FIG. 4, it is confirmed that the compound of Comparative Example 1 exhibits inferior phase stability when left at a relatively low temperature, and thus, the decomposition of the chalcogen-containing compound of $Sn_4Bi_2Se_7$ is generated, thus forming many secondary phases ($Bi_3Se_4$, $Bi_8Se_9$, $Sn_3Bi_9Se_{13}$) (The peaks resulting from the many secondary phases are confirmed in XRD pattern). To the contrary, it is confirmed that the compounds of Examples 1 to 3 maintain face-centered cubic lattice structures without generation of secondary phases, and exhibit excellent phase stability. Thus, it is confirmed that the compounds of Examples 1 to 3 exhibit excellent phase stability even at a relatively low temperature.

2. Temperature Dependency of Electrical Conductivity

Figure 5A:
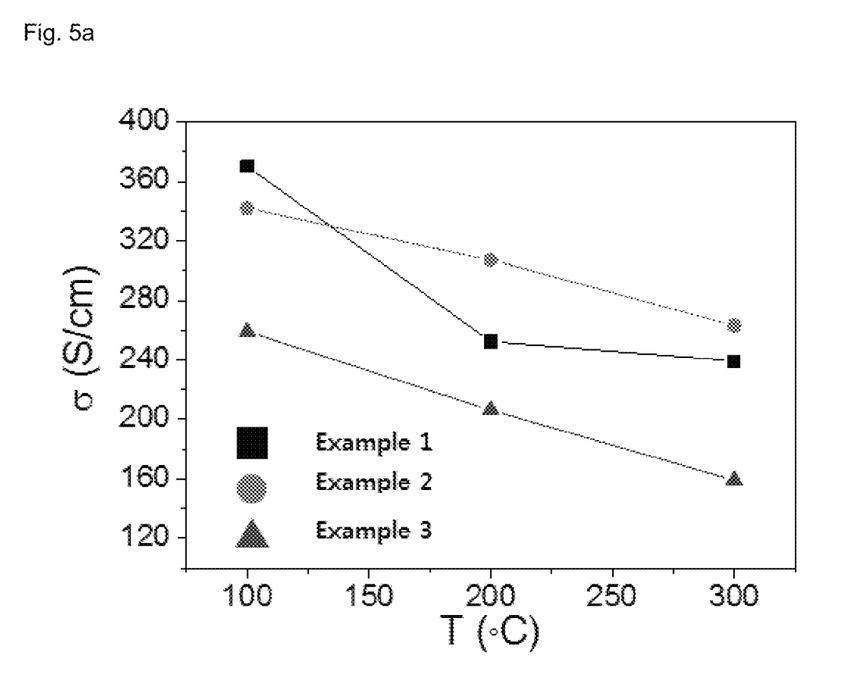
FIG. 5a is a graph showing results of measuring electrical conductivities of chalcogen compounds of Examples 1 to 3 according to temperature.

For the chalcogen-containing compound specimens prepared in Examples 1 to 3, electrical conductivities were measured according to temperature change and are shown in FIG. 5a. The electrical conductivity was measured at a temperature range of 100 to 300° C. through a four-probe direct current method, using a resistivity meter of LSR-3 from Linseis Inc.

Figure 5B:
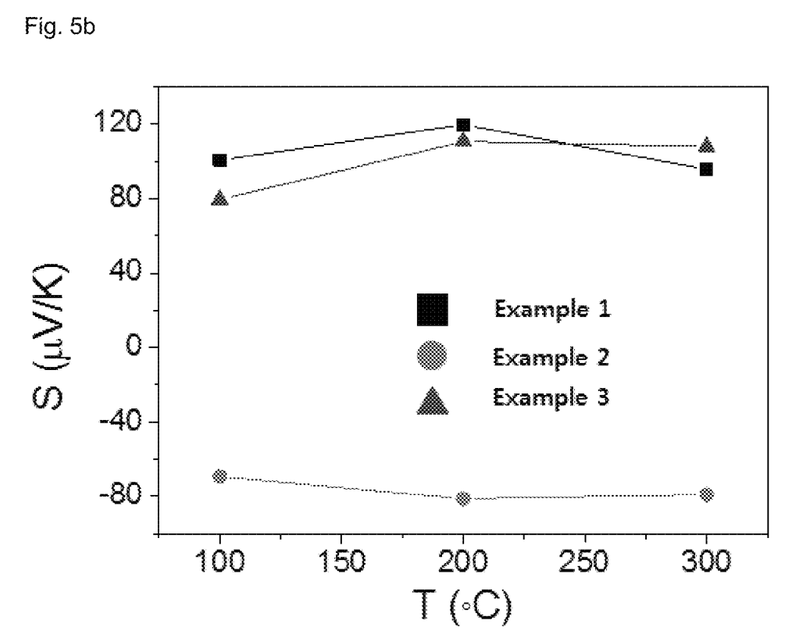
FIG. 5b is a graph showing results of measuring Seebeck coefficients of the chalcogen compounds of Examples 1 to 3 according to temperature.

Referring to FIG. 5a, it was confirmed that Examples 1 to 3 generally exhibit excellent electrical conductivities, and particularly, it was confirmed that electrical conductivities is in the order of Example 2>Example 1>Example 3. It is expected that Example 2 with higher alkali metal content has excellent electric conductivity because the alkali metal is cationized and can donate electrons, and that Example 3 exhibits relatively low electric conductivity because the content of Bi that is cationized into $Bi^{3+}$ and can donate more electrons is low, 3. Measurement of Seebeck Coefficient and Temperature Dependency of Seebeck Coefficient For the chalcogen-containing compound specimens prepared in Examples 1 to 3, Seebeck coefficients (S) were measured according to temperature change and are shown in FIG. 5b. The Seebeck coefficient was measured at a temperature range of 100 to 300° C. by differential voltage/temperature technique, using measuring equipment of LSR-3 from Linseis Inc.

As shown in FIG. 5b, it is confirmed that Examples 1 to 3 exhibit a positive or negative Seebeck coefficient that can be applied as thermoelectric conversion material.

However, comparing Examples 1 and 2, it is confirmed that as the content of an alkali metal increases from 0.2 to 0.4, the Seebeck coefficient changes from a positive (+) to a negative (−) value. It means that the main charge carrier of material is changed from holes to electrons due to the additional electron donation by the alkali metal, and indicates property change from P-type to N-type semiconductor material. It means that the main charge carrier in Example 1 is hole despite the additional electron donation by the alkali metal. As in Example 3, if the content of Bi decreases and the content of an alkali metal increases, the alkali metal donates less electrons compared to the Bi decrease, thus exhibiting P-type material property like Example 1.

4. Temperature Dependency of Output Factor

Figure 5C:
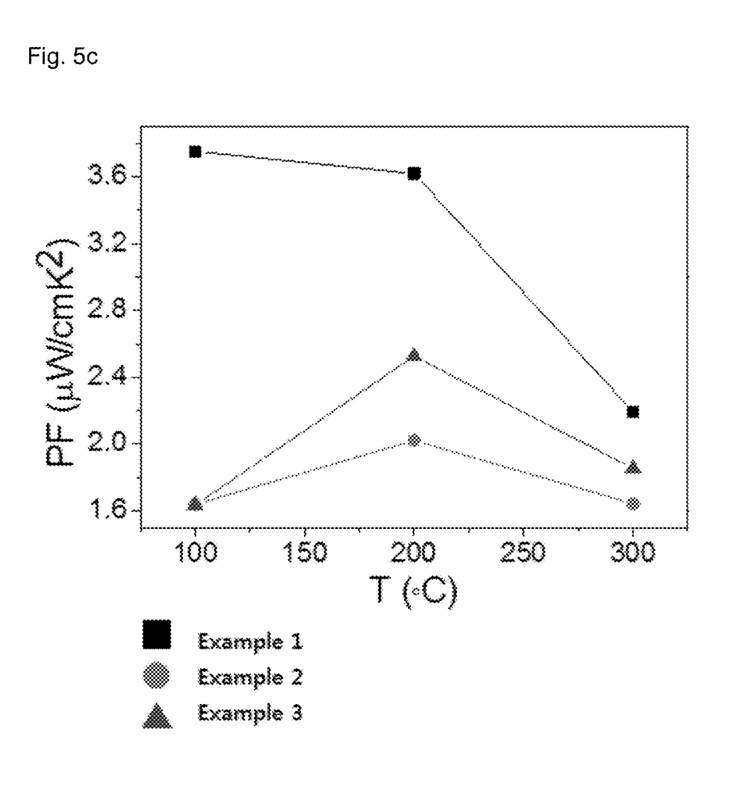
FIG. 5c is a graph showing results of measuring output factors of the chalcogen compounds of Examples 1 to 3 according to temperature.

For the chalcogen-containing compound specimens prepared in Examples 1 to 3, output factors were calculated according to temperature change and are shown in FIG. 5c.

The output factor is defined as power factor $(PF)=\sigma S^2$, and it was calculated using the values of σ (electrical conductivity) and S (Seebeck coefficient) shown in FIGS. 5a and 5b.

As shown in FIG. 5c, it was confirmed that Examples 1 to 3 generally exhibit excellent output factors, and among them, the specimen of Example 1 exhibits most excellent output factor. Particularly, the output factor measured at 100° C. was about 3.62 μW/cmK².

Figure 5D:
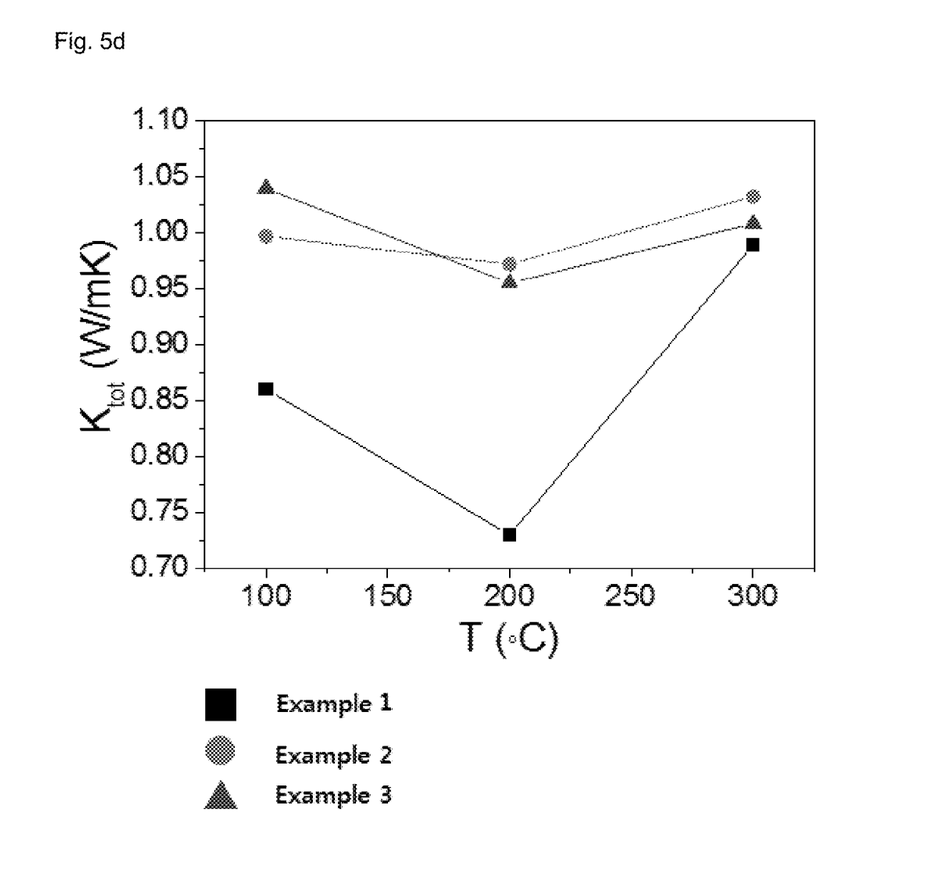
FIG. 5d is a graph showing results of measuring thermal conductivities of the chalcogen compounds of Examples 1 to 3 according to temperature.
Figure 5E:
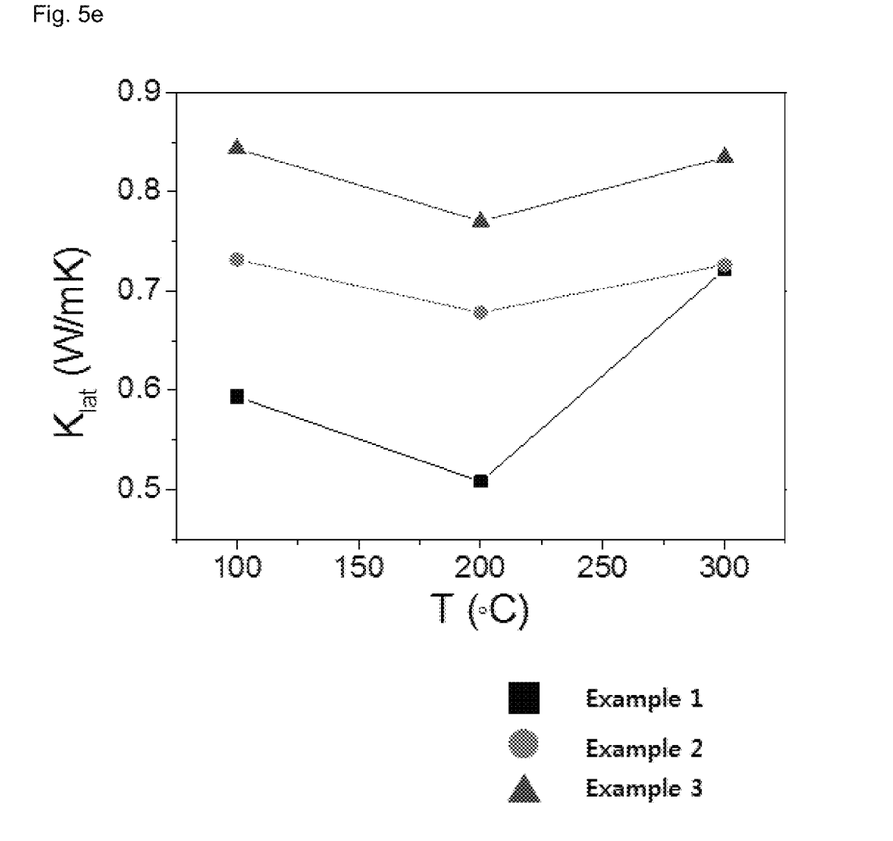
FIG. 5e is a graph showing results of measuring lattice thermal conductivities of the chalcogen compounds of Examples 1 to 3 according to temperature.

5. Temperature Dependency of Thermal Conductivity and Lattice Thermal Conductivity For the chalcogen-containing compound specimens prepared in Examples 1 to 3, thermal conductivities and lattice thermal conductivities were measured according to temperature change and are shown in FIG. 5d and FIG. 5e, respectively. For the measurement of thermal conductivity, first, thermal diffusivity (D) and heat capacity ($C_p$) were measured by a laser flash method, using thermal conductivity measuring equipment of LFA457 from Netzsch Company. The measured values were applied in the equation "thermal conductivity (k)=$D\rho C_p$ (ρ is the density of a sample measured by Archimedes' principle)".

Further, total thermal conductivity (k=$k_L$+$k_E$) is divided into lattice thermal conductivity ($k_L$) and thermal conductivity ($k_E$) calculated according to Wiedemann-Franz law ($k_E$=LσT), wherein, as the Lorentz number (L), a value calculated from the Seebeck coefficient according to temperature was used.

Referring to FIGS. 5d and 5e, Examples 1 to 3 generally exhibit low thermal conductivities and lattice thermal conductivities. Particularly, despite $k_E$ contributing to high electric conductivity, the specimen of Example 1 exhibits the lowest thermal conductivity because the lattice thermal conductivity is relatively the lowest as shown in FIG. 5e. The lattice thermal conductivity decreases as the concentration of the vacancy in the lattice increases, as shown in Table 2. Particularly, at 200° C., the specimen of Example 1 exhibited very low lattice thermal conductivity (0.51 W/mK).

6. Temperature Dependency of Thermoelectric Figure of Merit (ZT)

Figure 5F:
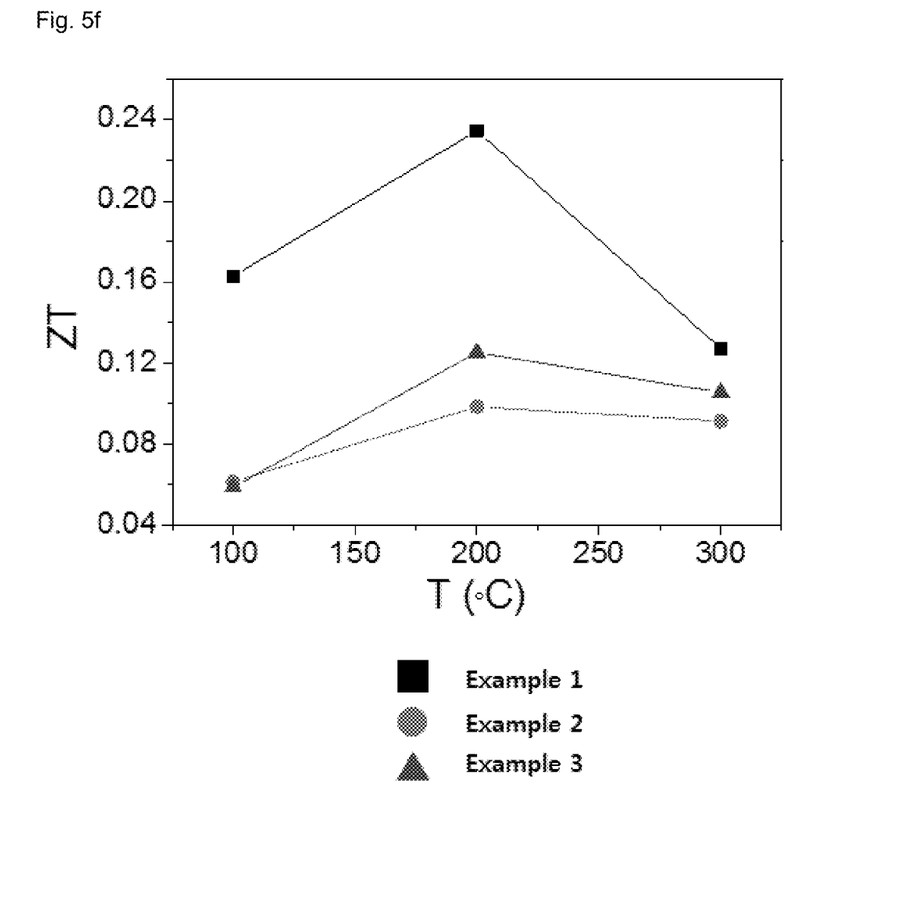
FIG. 5f is a graph showing results of measuring thermoelectric figures of merit of the chalcogen compounds of Examples 1 to 3 according to temperature.

For the chalcogen-containing compound specimens prepared in Examples 1 to 3, the thermoelectric figures of merit were calculated according to temperature change and are shown in FIG. 5f. The thermoelectric figure of merit is defined as ZT=$S^2\sigma T/k$, and it was calculated using the S (Seebeck coefficient), σ (electrical conductivity), T (absolute temperature), and k (thermal conductivity) values obtained in experimental examples.

Referring to FIG. 5f, it was confirmed that Examples 1 to 3 exhibit excellent thermoelectric figures of merit that can be applied as a thermoelectric conversion material. Specifically, as the temperature rises, the ZT value increased until 200° C., and thereafter, tended to decrease. The specimen of Example 1 exhibited most excellent thermoelectric figure of merit (ZT=0.24) at 200° C.

The invention claimed is:

1. A chalcogen-containing compound represented by the following Chemical Formula 1:

[Chemical Formula 1]

wherein, in Chemical Formula 1, M is an alkali metal,
x, y and z are mole ratios of M, Sn, and Bi respectively,
x is greater than 0.05 and equal to or less than 0.8, y is greater than 3.5 and equal to or less than 4, z is greater than 1.5 and equal to or less than 2, y+z is greater than 5 and equal to or less than 6, and x+y+z is greater than 5 and equal to or less than 6.8.

2. The chalcogen-containing compound according to claim 1, wherein M is one or more alkali metals selected from the group consisting of Na, and K.

3. The chalcogen-containing compound according to claim 1, wherein the compound has a crystal structure of a face-centered cubic lattice structure.

4. The chalcogen-containing compound according to claim 3, wherein M fills a part of a vacancy excluding the sites filled with Se, Sn and Bi in the face-centered cubic lattice structure.

5. The chalcogen-containing compound according to claim 3, wherein
the Se fills anion sites of the face-centered cubic lattice structure,
the Sn and Bi fill cation sites of the face-centered cubic lattice structure, and the M fills a part of a vacancy of remaining cation sites, excluding the sites filled with Sn and Bi.

6. The chalcogen-containing compound according to claim 1, wherein the compound is suitable for use as a thermoelectric conversion material.

7. A method for preparing the chalcogen-containing compound of claim 1, comprising the steps of:
progressing a solid phase reaction of a mixture comprising raw materials comprising Sn, Bi and Se, and raw material comprising alkali metal;
grinding the product of the solid phase reaction; and
sintering the ground product.

8. The method for preparing a chalcogen-containing compound according to claim 7, wherein the raw material comprising alkali metal comprises $M_2Se$ powder, wherein M is an alkali metal.

9. The method for preparing a chalcogen-containing compound according to claim 7, wherein the raw materials comprising Sn, Bi and Se are each a powder and the raw material comprising alkali metal is a powder, and wherein the solid phase reaction is performed at a temperature of 500 to 700° C., for each powder raw material.

10. The method for preparing a chalcogen-containing compound according to claim 7, further comprising a step of cooling a product of the solid phase reaction to form an ingot, between the solid phase reaction step and the grinding step.

11. The method for preparing a chalcogen-containing compound according to claim 7, wherein the sintering step is performed by a spark plasma sintering method.

12. The method for preparing a chalcogen-containing compound according to claim 7, wherein the sintering step is performed at a temperature of 550° C. or more and a pressure of 10 MPa or more.

13. A thermoelectric element comprising the chalcogen-containing compound according to claim 1, as a thermoelectric conversion material.

* * * * *